US006177895B1

(12) United States Patent
Vrancic et al.

(10) Patent No.: US 6,177,895 B1
(45) Date of Patent: Jan. 23, 2001

(54) SELECTIVE DIGITAL INTEGRATOR

(75) Inventors: Aljosa Vrancic, Austin, TX (US); Kresimir Rupnik; Sean P. McGlynn, both of Baton Rouge, LA (US)

(73) Assignee: Board of Supervisors of Louisiana State University and Agricultural and Mechanical College, Baton Rouge, LA (US)

( * ) Notice: Under 35 U.S.C. 154(b), the term of this patent shall be extended for 0 days.

(21) Appl. No.: 09/240,642

(22) Filed: Jan. 27, 1999

(51) Int. Cl.[7] ............................ H03M 1/00; H03M 1/12
(52) U.S. Cl. ............................ 341/132; 341/155
(58) Field of Search ............................ 341/132, 155, 341/143, 159–165; 708/422; 702/68

(56) References Cited

U.S. PATENT DOCUMENTS

| | | | | |
|---|---|---|---|---|
| 3,701,894 | | 10/1972 | Low et al. . | |
| 4,692,890 | | 9/1987 | Arseneau . | |
| 4,807,146 | | 2/1989 | Goodrich . | |
| 5,327,133 | * | 7/1994 | Greene | 341/143 |
| 6,072,417 | * | 6/2000 | Staton | 341/165 |

OTHER PUBLICATIONS

Purdie, N., "Characterization of Biomolecules Using Circular Dichroism Spectroscopy," *Spectroscopy*, vol. 12, No. 2, pp. 45–55 (1997).

Rupnik, K. et al., "A New Modulated–Polarization Spectroscopy (MPS) Study of Electronic Structures of Molecules," *Bull. Amer. Phys. Soc.*, vol. 42, No. 2, p. 987 (1997).

(List continued on next page.)

*Primary Examiner*—Patrick Wamsley
(74) *Attorney, Agent, or Firm*—John H. Runnels

(57) ABSTRACT

A device and method are disclosed for the acquisition of data at high flow rates and with high accuracy. The device, called a "Selective Digital Integrator" (SDI), provides many improved features relative to older techniques, and in certain instances it provides a less-expensive replacement for lock-in amplifiers while affording greater functionality and versatility. The device can be integrated into existing instrumentation and technology for high-resolution measurements using various radiation sources (e.g., lamps, lasers, synchrotrons), various polarizations (e.g., linear, circular, elliptical), and various detectors (e.g., photo multipliers, diodes). Unlike the case with conventional lock-in amplifiers, the signal need not be known (or presumed) in advance to have a particular shape, but instead may have an arbitrary or unknown waveform. Examples of the new capabilities include the ability to measure circular dichroism by separating out the left circular and right circular components of that spectrum; and the ability to make polarization-selective measurements that simultaneously measure both linear and circular dichroism. The device has a substantially better signal-to-noise ratio than that of previous systems. It has the ability to perform over wide (and continuous) ranges of signal strength. It has a wide dynamic range (~10 orders of magnitude). It is particularly good at separating and discriminating small signal components. It has high time-, spectral-, polarization-, and average-value-of-detector-current resolution (~1 part in $10^{10}$). Applications where the SDI device will be useful include, for example, the following areas: chemistry (e.g., analysis); pharmaceuticals (e.g., molecular structures and configurations); electronics (e.g., as replacements for lock-in amplifiers as part of data acquisition systems); materials science (e.g., crystal structures, optical and magneto-optical properties, films, thin layers, etc.); medicinal chemistry and physics (e.g., structures and properties of molecules in molecular medicine); environmental measurements and studies (e.g., data acquisition for environmental studies); and physics and chemistry (research pertaining to electronic and nuclear structures).

50 Claims, 12 Drawing Sheets

OTHER PUBLICATIONS

Rupnik, K. et al., "A New Modulated–Polarization Spectroscopy (MPS) Study of Electronic Structures of Molecules," Slides, Joint Meeting of the American Physical Society et al. (Apr. 18–21, 1997).

Rupnik, K. et al., "The Simulation of an Unusual Magnetic Circular Dichroism Spectrum: The 5p→6s $^1\Sigma_0^+ \rightarrow {}^3\Pi_2$ transition of HI," *Journal of Physical Chemistry*, vol. 103, pp. 7661–7663 (1995).

Scott, J. et al., "Molecular Rydberg Transitions: Field Effects in the Vacuum Ultraviolet," *Nuclear Instruments and Methods*, vol. 152, pp. 231–234 (1978).

Stanford Research Systems, *Scientific and Engineering Instruments*, pp. 56–81 (1992).

Vrancic, A., *A Selective Digital Integrator —The New Device for Modulated Polarization Spectroscopy*, PhD Dissertation, Louisiana State University, Baton Rouge (May 1998).

Vrancic, A. et al., "A Selective Digital Integrator for Modulated–Polarization Spectroscopy: An Evaluation using (+)–3–Methylcyclopentanone," accepted for publication in *Review of Scientific Instruments* (1998).

* cited by examiner

SELECTIVE DIGITAL INTEGRATOR

The benefit of the Feb. 2, 1998 filing date of provisional application nnnnn (which was a conversion of nonprovisional application Ser. No. 09/016,916) is claimed under 35 U.S.C. § 119(e).

This invention pertains to apparatus and methods for acquiring and processing experimental data at high rates of data flow.

There is an unfilled need for improved, more accurate, and less expensive apparatus and methods for acquiring and processing experimental data over short or long times at high rates of data flow, for example 20 MSPS (mega samples per second), 25 MSPS, 100 MSPS, 500 MSPS, 1 GSPS (giga samples per second) or higher. Such apparatus might be used, for example, to monitor rotational, vibrational, and electronic spectra under varying conditions. Such improved apparatus and methods would be used by chemists, biologists, materials scientists, medicinal chemists, physicists, and others. Currently available electronic and optical measurement instruments and devices have limited applications. There is a trade-off: some current instruments are aimed at very fast data acquisition, while others focus on data processing formats yielding high accuracy; or aim at both if only a few parameters are of interest and the signal waveform is known (or presumed) in advance to have a particular shape, e.g., sinusoidal or square wave. But it has not previously been possible to do both simultaneously for data signals of arbitrary or unknown waveform.

N. Purdie, "Characterization of Biomolecules Using Circular Dichroism Spectroscopy," *Spectroscopy,* vol. 12, no. 2, pp. 45–55 (1997) reviews the use of circular dichroism measurements in biomolecules such as carbohydrates, peptides, and proteins.

J. Scott et al., "Molecular Rydberg Transitions: Field Effects in the Vacuum Ultraviolet," *Nuclear Instruments and Methods,* vol. 152, pp. 231–234 (1978) reviews an earlier state of the art, and describes certain magnetic circular dichroism and electric linear dichroism measurements of Rydberg transitions using apparatus that included a lock-in-amplifier to acquire data.

K. Rupnik et al., "The Simulation of an Unusual Magnetic Circular Dichroism Spectrum: The 5p→6s ${}^1\Sigma_0^+ \to {}^3\Pi_2$ transition of HI," *Journal of Physical Chemistry*, vol. 103, pp. 7661–7663 (1995), representative of the previous state of the art, presents both measured absorption and magnetic circular dichroism spectra, and a model of those spectra for a particular electronic transition of HI.

U.S. Pat. No. 4,807,146 discloses a digital lock-in amplifier.

Stanford Research Systems, *Scientific and Engineering Instruments,* pp. 56–81(1992) describe more-or-less state-of-the-art lock-in amplifiers.

References by the inventors disclosing portions of the present work, all of which are either unpublished as of the original filing date of the present application, or were published less than twelve months prior to the original filing date of the present application, include the following: K. Rupnik et al., "A New Modulated-Polarization Spectroscopy (MPS) Study of Electronic Structures of Molecules," Slides, Joint Meeting of the American Physical Society et al. (Apr. 18–21, 1997) and *Bull. Amer. Phys. Soc.,* vol. 42, p. 987 (1997); A Vrancic et al., "A Selective Digital Integrator for Modulated-Polarization Spectroscopy: An Evaluation using (+)-3-Methylcyclopentanone," accepted for publication in *Review of Scientific Instruments* (1998); and A. Vrancic, *A Selective Digital Integrator—The New Device for Modulated Polarization Spectroscopy,* PhD Dissertation, Louisiana State University, Baton Rouge (May 1998).

We have discovered a new device and method for the acquisition of data at high flow rates and with high accuracy. We initially designed the device for use in polarization and field-dependent spectroscopy, but it has much wider application. The novel device, called a "Selective Digital Integrator" (SDI), provides many improved features relative to older techniques, and for some applications it provides a less-expensive replacement for lock-in amplifiers while affording greater functionality and versatility. The device can be integrated into existing instrumentation and technology for high-resolution measurements using various radiation sources (e.g., lamps, lasers, synchrotrons), various polarizations (e.g., linear, circular, elliptical), and various detectors (e.g., photo multipliers, diodes). Unlike the case with conventional lock-in amplifiers, the signal need not be known (or presumed) in advance to have a particular shape, but instead may have an arbitrary or unknown waveform.

Other new capabilities of the novel Selective Digital Integrator (SDI) include the ability for the first time to measure circular dichroism by separating out the left circular and right circular components of that spectrum; and the ability for the first time to make polarization-selective measurements that simultaneously measure both linear and circular dichroism.

The novel device has a substantially better signal-to-noise ratio than those of previous systems. It has the ability to perform over wide (and continuous) ranges of signal strength. It has a wide dynamic range (~10 orders of magnitude). It is particularly good at separating and discriminating small signal components. It has high time-, spectral-, polarization-, and average-value-of-detector-current resolution (~1 part in $10^{10}$).

The new device can accurately measure very small signals, e.g., where the AC component of interest has a signal strength less than $10^{-3}$ the strength of the DC component, even if the signal is buried in substantial noise. The SDI was originally designed for use with detectors that produce pulsed signals, for example a photo-multiplier tube (PMT). When used in such a configuration, the device had a wide gain-switching-free dynamic range, and can detect light intensities ranging from about 1 photon per second up to the PMT saturation point, a range of 10 orders of magnitude or greater.

In molecular spectra that have been measured with a prototype embodiment, the SDI has performed at higher specifications than any previously described devices. For example, the resolution of vibronic spectra in a standard test molecule, 3-methylcyclopentanone, is higher than has been reported in any previously published studies of this molecule, including prior spectra measured at ostensibly much higher spectral resolution, and with substantially higher light (i.e., synchrotron) intensities.

Applications where the SDI device will be useful include, for example, the following areas: chemistry (e.g., analysis); pharmaceuticals (e.g., molecular structures and configurations); electronics (e.g., as replacements for lock-in amplifiers as part of data acquisition systems); materials science (e.g., crystal structures, optical and magneto-optical properties, films, thin layers, etc.); medicinal chemistry and physics (e.g., structures and properties of molecules in molecular medicine); environmental measurements and studies (e.g., data acquisition for environmental studies); and physics and chemistry (research pertaining to electronic and nuclear structures).

An SDI can be used, among other things, as a replacement for the lock-in amplifiers that are a standard part of many instrumentation setups, such as those used in modulation spectroscopy. A principal application of SDI is the extraction of time-resolved signal from background noise.

Measurements made with SDI are qualitatively and quantitatively better than those obtained with a lock-in amplifier, because the SDI requires no a priori assumption about particular waveforms for a signal (e.g., sinusoidal or square-wave). The signal-to-noise ratio for SDI is considerably better than that for a lock-in amplifier for many types of waveforms. SDI is far superior to a lock-in amplifier in measuring asymmetric or multi-phase modulated signals.

Advantages of the novel SDI include the following: It can provide an average time-resolved profile of a modulated signal. As compared to prior lock-in amplifiers, it virtually eliminates errors associated with non-sinusoidal signals, even where the signal shape is not known in advance. It permits the separate measurement of different phases of a modulated signal. It permits the simultaneous measurement of circular dichroism and linear dichroism spectra. It has a wide, gain-switching-free dynamic range (10 orders of magnitude or more). It admits a constant signal-to-noise mode of operation. It eliminates the need for photomultiplier voltage feedback. It is capable of very fast scanning speeds. It is capable of high time resolution, and high selectivity. It is well-suited for low (or zero) overhead, on-the-fly processing.

Figure 1:
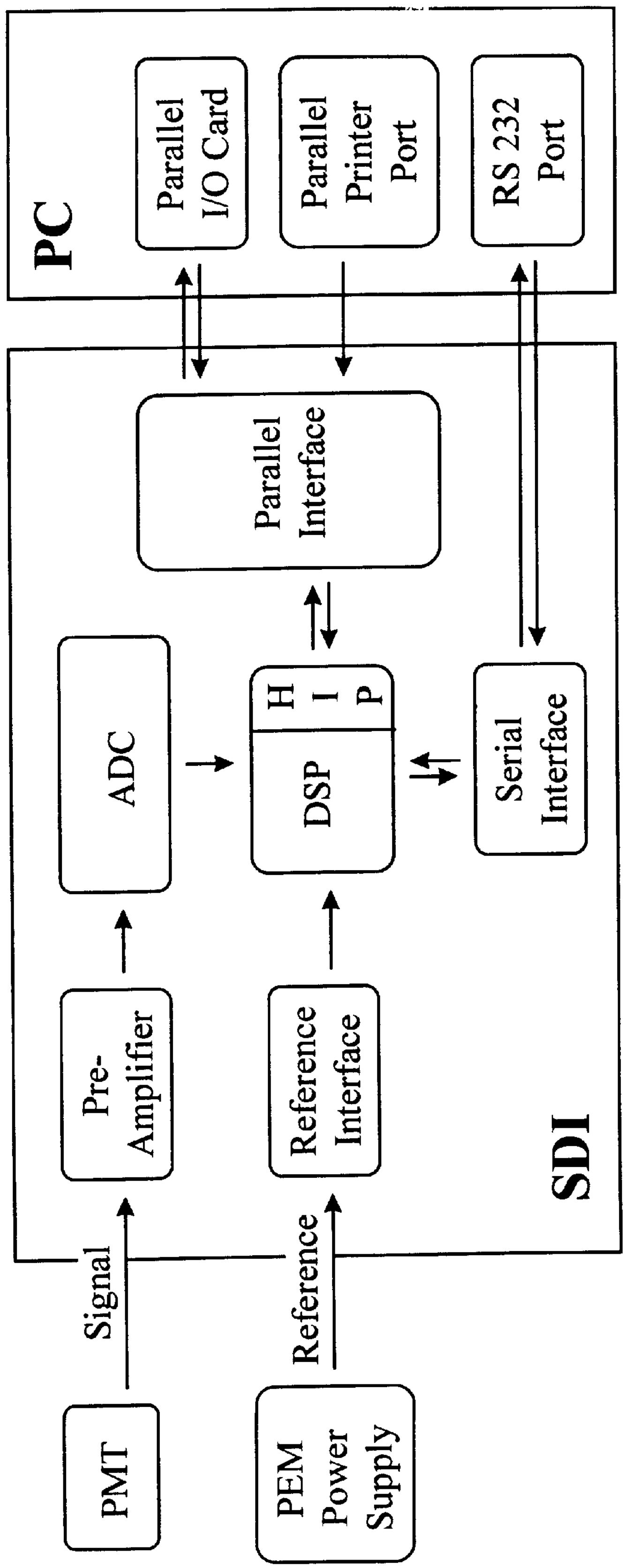
FIG. 1 schematically depicts one embodiment of a selective digital integrator in accordance with the present invention.

One embodiment of the Selective Digital Integrator, or SDI, is illustrated schematically in FIG. 1. This SDI comprised six principal components: a reference interface, a current-to-voltage (I/V) converter/preamplifier (PA), a 48 MHz 8-bit analog-to-digital converter (ADC) block, a 24 MHz digital signal processor (DSP), a parallel interface, and a serial interface.

In the reference interface, the incoming reference signal from a modulation control unit was transformed into a transistor-transistor logic (TTL) pulsed signal used by the DSP for synchronization purposes. The reference signal used in the prototype embodiment was a ~50 KHz sine wave supplied by the power supply for a photo-elastic modulator (PEM); positive and negative reference signals corresponded to the handedness of polarized light from the PEM. In the preamplifier, the photomultiplier tube (PMT) output current signal was converted, amplified, and conditioned so that it could be accurately digitized by the ADC block. The digitized signal was then immediately processed by the DSP and sent to a computer through the host interface port (HIP). Hardware in the parallel and serial interface blocks exchanged information between the SDI and a digital computer (not illustrated).

Individual components of this embodiment are described further below.

I/V Converter-Preamplifier-Signal Shaper

The large dynamic range achieved in amplifying photomultiplier tube signals was made possible by conditioning the PMT signal in the preamplifier. When a photon struck the PMT, a fast (5 ns) current pulse occurred at the tube output. The preamplifier performed the following five functions upon the PMT signal: (1) converted the PMT current signal into a voltage signal; (2) amplified the converted signal; (3) widened pulses corresponding to individual photons from about 5 ns to about 400 ns; (4) adjusted the signal for offsets in the analog circuitry before presenting the signal to the SDI converters; and (5) (where necessary) limited output signal strength to a maximum of 1.8 V, to protect the analog to digital converters in the SDI.

Widening the peaks associated with individual photons was an important function of the preamplifier. The peaks are preferably widened to at least five times the width of the sampling interval of the processor, which is defined as the time between two consecutive DSP readings of the output of the ADC block. The height of the amplified signal peak should be such that at least 1, and preferably at least 5 points within the peak are above the threshold for detection by the ADC. A fast 8-bit, low-resolution ADC may not be directly usable for detecting small signals, due to limited resolution of the converter. For example, if an increase of 1/256 V in the input signal is required to change the output of the ADC by 1 bit, an oscillation less than 1/256 V might remain undetected. A fast, but low-resolution ADC requires large changes in the input signals. A widened-pulse output from the preamplifier satisfied this condition. Because the ADC was fast enough to collect 10 samples, pulse areas and shapes could be obtained with adequate precision. Therefore signal integration could be performed digitally without gain switching; furthermore, any noise and threshold problems in the photon counting technique were greatly reduced by this integration.

When combined with a fast analog-to-digital converter and a PMT, the preamplifier allowed construction of a wide dynamic range digital integrator with a minimal lower limit (it can detect one current pulse per second, ~1 pA), and an upper limit close to the PMT saturation point when widened pulses heavily overlap. In experiments performed in our laboratory to date, the dynamic range of a device based on such an preamplifier has been 10 orders of magnitude or greater. The same is true when other types of pulsed detectors are used, such as "channeltrons" used for detection of electrons. Noise and threshold problems in the photon-count setups were greatly reduced by use of the preamplifier.

The bandwidth of the SDI is preferably at least about 20 MHz, more preferably at least about 25 MHz, 100 MHz, 500 MHz, 1 GHz, or more.

Figure 2:
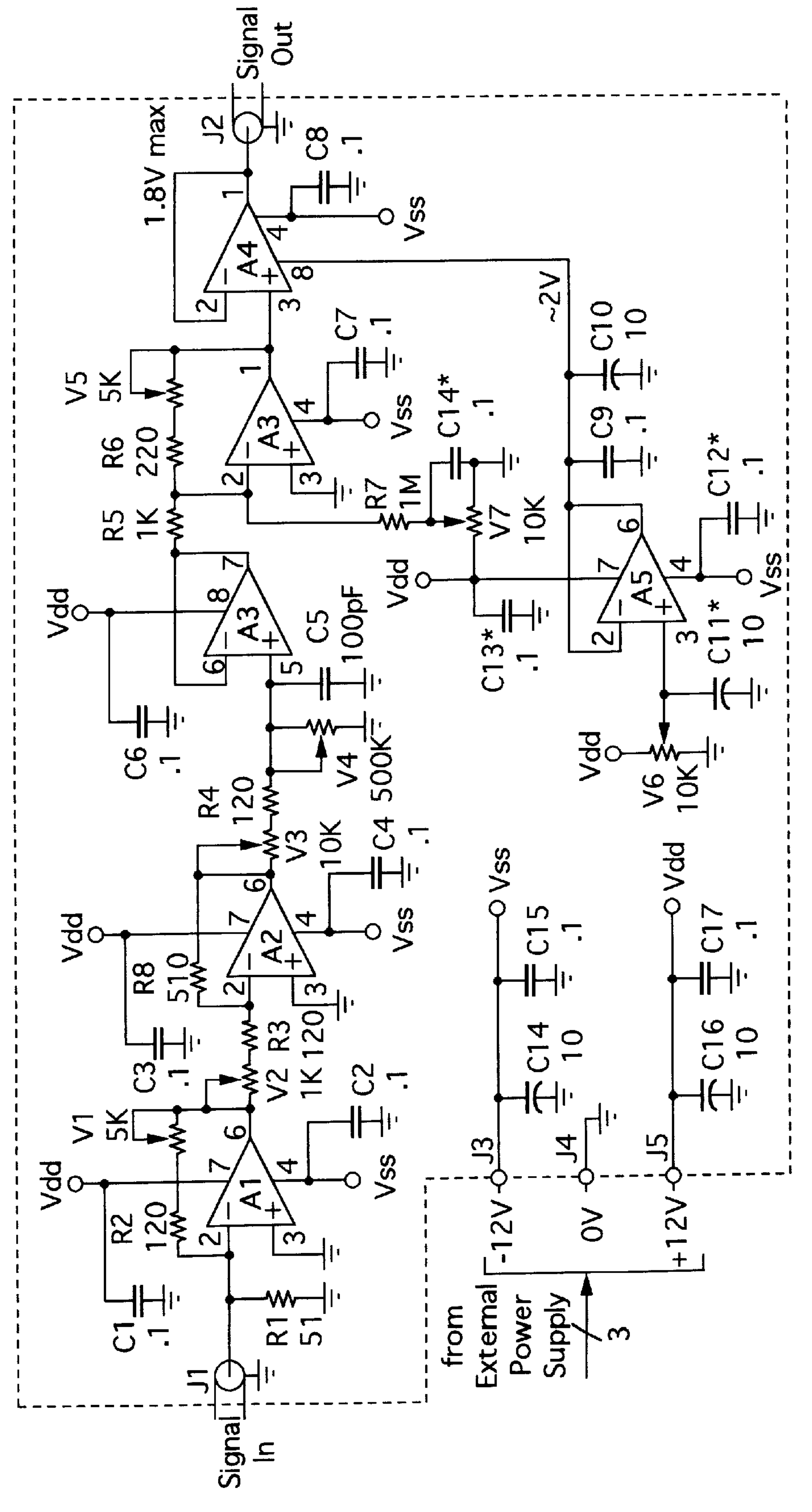
FIG. 2 depicts a schematic layout of a preamplifier used in one embodiment of the present invention.
Figure 3:
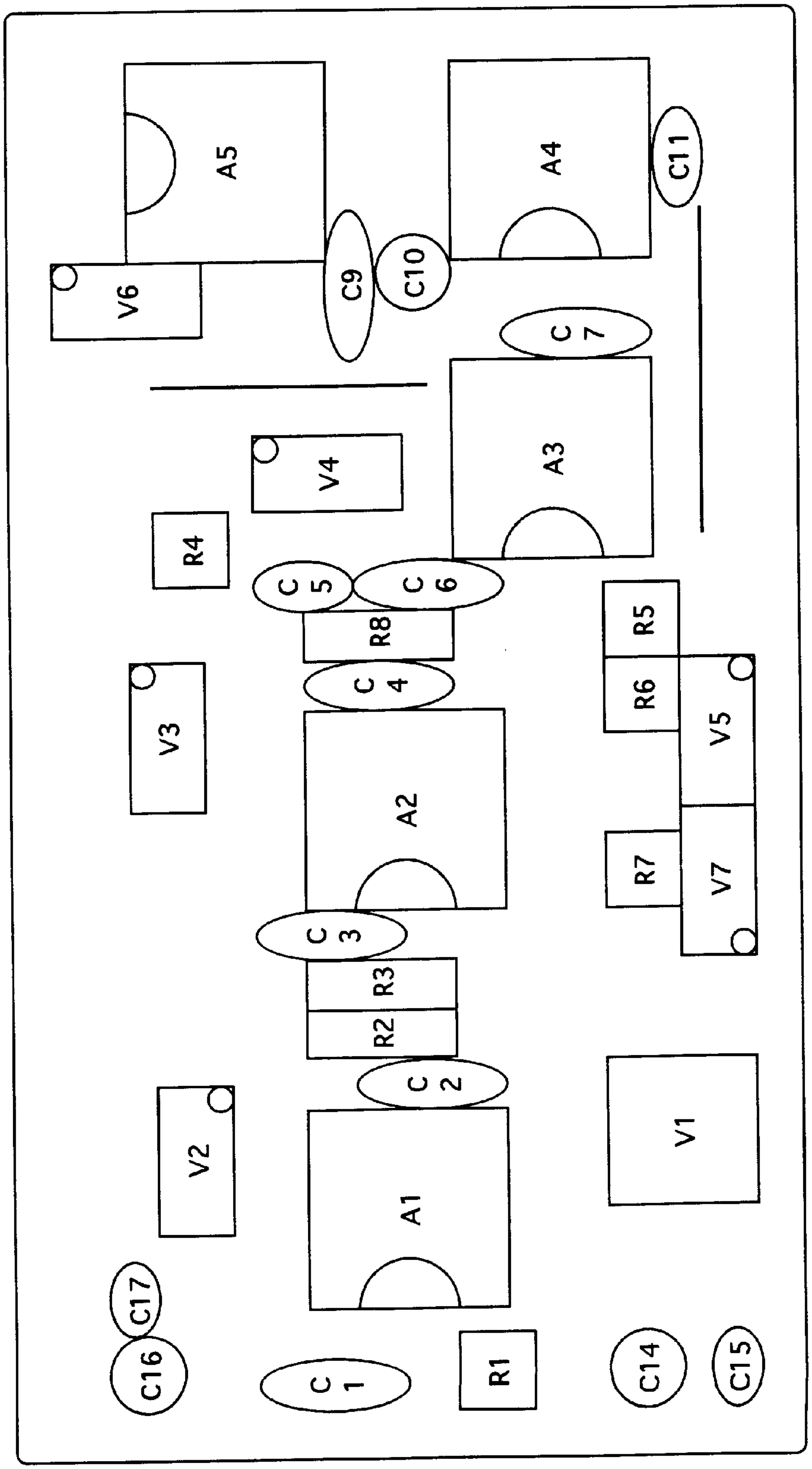
FIG. 3 depicts an element layout of a preamplifier used in one embodiment of the present invention.

Detailed schematic and element layouts of the preamplifier used in this embodiment are illustrated in FIGS. 2 and 3, respectively. In all circuit drawings, capacitance is given in μF, and resistance is given in ohms. In FIG. 2, A1 is AD844AN; A2 is AD843JN; A3 and A4 are both AD712JN; A5 is SK3552; V1 is one turn; V3 and V7 are both 20 turns; and all other trimmers V are 10 turns.

To achieve the goals stated above, the preamplifier contained five stages. In the first stage, built around an ultra-fast current feedback amplifier AD844AN (A1), input current pulses were converted into voltage pulses. The conversion (amplification) constant was determined by the R2+V1 combination, and could range from ~−120 V to ~−5120 V. Further voltage amplification occurred in the next stage, built around AD843JN (A2). The gain was determined by the R8: (R3+V2) ratio, and could range from ~−0.5 to ~−4.5. Following the amplification stage came the peak widening stage, built around AD712JN (A3). The amplified output from A2 was first scaled down by the V3+R4 and V4 resistor network. In addition to the voltage scaling, the resistor network also determined the charging and discharging RC constant for the voltage on capacitor C5, through which short (5–10 ns) pulses on the output of A2 were widened. The voltage on C5 was fed to the non-inverting input of one of the A3 amplifiers, which was in the emitter follower setup and served as a buffer. The other amplifier was used for inverting, amplification, and offset adjustment. The gain was determined from the R5:R6+V5 ratio and ranged from ~−0.2 to ~−5.2. The offset could be adjusted using a precise, 20 turn trimmer V7. Finally, another AD712JN (A4) was used as an output buffer and limiter. Limiting was achieved by lowering the positive supply voltage of A4 to ~2 V. This voltage caused the A4 output to saturate at about 1.8 V, thus protecting the converters (which can handle input voltages of up to 2 V). The value of the limited supply voltage was determined by trimmer V6, whose output was buffered by A5 and filtered by capacitors C9 through C11. The overall amplification of the previous stages was chosen so that the majority of the time (over 99%) the signal on the input of A4 did not exceed 1.5 V, which is the SDI ADC input range. All operational amplifiers had a 0.1 μF bypass capacitor on each power pin. Also, the voltage supplied by the external power supply was filtered with the C14–C15 and C16–C17 capacitor pairs. (Capacitors C11–13, were not actually included in the prototype embodiment of the preamplifier due to space limitations. However, they will be included in future embodiments.)

In future embodiments, a printed circuit board and eventually an integrated circuit will be designed for the PA to further reduce noise (although even with the present embodiment on a project board the noise levels were low enough not to significantly affect A-to-D conversions with the currently used fast 8-bit converters). Higher resolution ADCs (e.g., 12-bit or 16-bit) will be used in the ADC block. Also, future embodiments of the PA will be designed to allow convenient computer control of the following parameters: gain control in the I/V stage; gain control in the voltage amplifier stage; peak shape control in the peak shaping stage; offset and gain control in the second voltage amplification stage; and maximum amplitude control in the limiter stage.

Reference Interface

The main task of the reference interface was to assist the DSP with synchronization. Information about phase within a cycle can, for example, be transmitted by a pulse signaling the beginning of a new period; or a continuous voltage that is modulated or altered in a manner to transmit that information. For example, in an initial embodiment a sinusoidal voltage from the PEM was used to indicate the modulation of light polarization. However, since information input to the prototype DSP had to be a TTL type of signal, i.e., either 1 (+5 V) or 0 (0 V), a conversion was needed. The reference interface made that conversion with a fast voltage comparator (discriminator). The comparator compared the input and threshold voltages and, depending on whether the input voltage was above or below the threshold, it set the output to one of the two extreme values (the positive or negative power supply voltages). This voltage was then sent through a switching transistor and a Schmitt invertor and converted into 0 V or +5 V, i.e., a TTL compatible signal. This signal was then used by the DSP for synchronization. In a prototype embodiment, the threshold voltage was fixed at 0 V.

Figure 4:
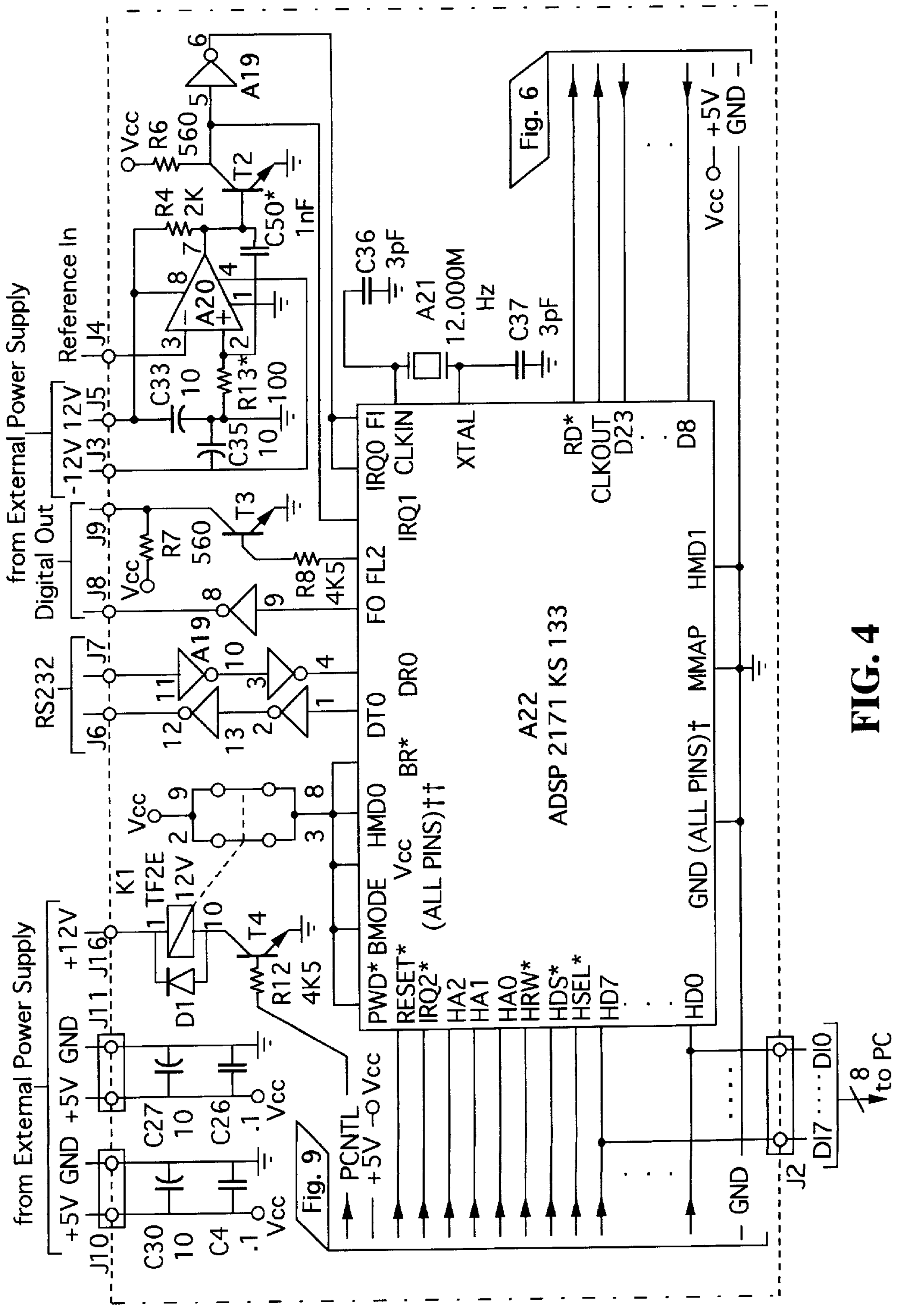
FIG. 4 depicts the reference interface circuitry used in one embodiment of the present invention.

One embodiment of the reference interface circuitry is shown in FIG. 4. All DSP $V_{cc}$ pins were grounded with 0.1 μF capacitors. A19 was SN74AS14; A20 was SK3567A; T2, T3, and T4 were NPN switching transistors; and D1 was 1N4001.

The reference signal entered the SDI through BNC connector J4, and was fed to the inverting input of voltage comparator A20, where it was compared with the threshold voltage applied to the non-inverting input of the discriminator. In the SDI the threshold was set to 0 V (the non-inverting pin was connected directly to ground). When the voltage on the inverting input rose above the threshold, the output of A20 went negative; when the input fell below 0 V, the output went positive. The comparator output, pulled up with resistor R4, was then converted to a TTL signal through the T2~R6 combination. The output of T2 and its Schmitt trigger inverted counterpart (A19) could be used by the DSP to detect the rising and falling edges of the reference TTL signal.

The prototype embodiment of the reference interface just described can encounter problems if sufficient noise is superimposed on the incoming reference signal. In particular, output oscillations could occur if noise is present at the moment when the reference voltage on the comparator input is close to the threshold. One way to inhibit such oscillations is to place a feedback capacitor (C50*) and a small resistor (R13*) between the threshold voltage source and the negative input as shown in FIG. 4. (These elements were not part of the initial prototype.) This way, the negative/positive charge on the comparator output, corresponding to being above/below the threshold state of the negative input, is transferred to the positive input through the capacitor, lowering/increasing the threshold voltage and creating a positive feedback loop that inhibits oscillations and forces the comparator to a stable state quickly. Recovery of the threshold input voltage is determined by the (C50*) (R13*) time constant. Another planned modification is to make the threshold voltage adjustable.

ADC Block

Figure 5:
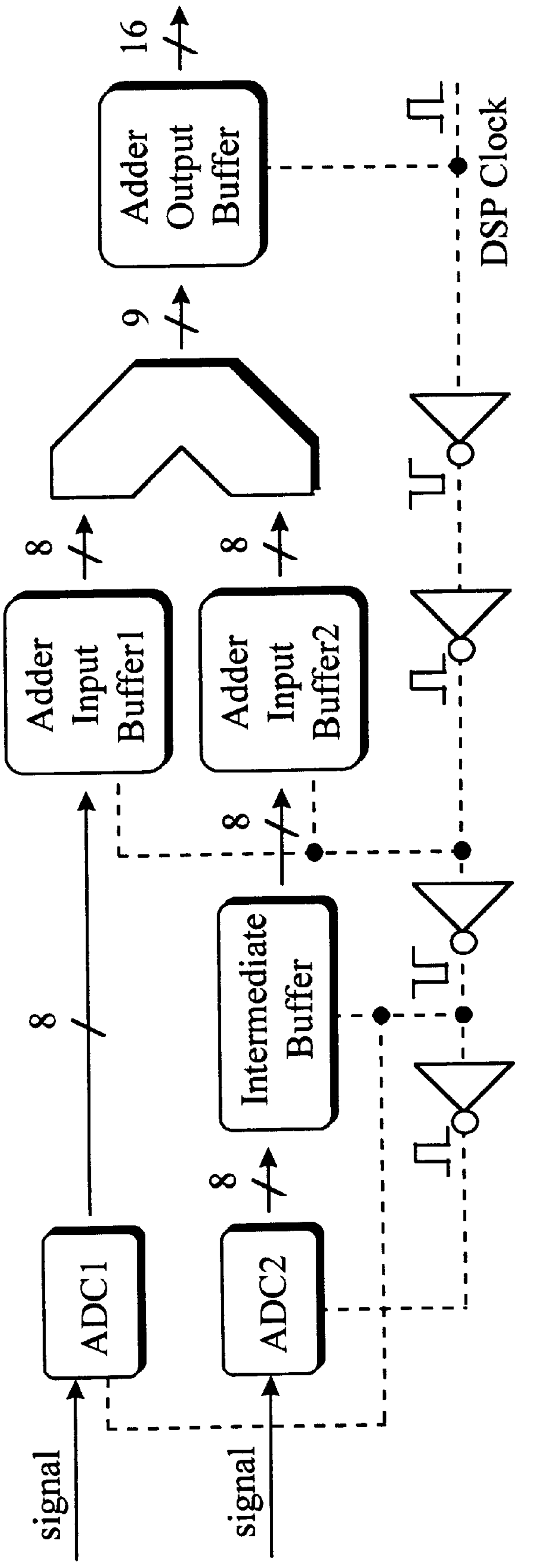
FIG. 5 schematically depicts the ADC used in one embodiment of the present invention.

A significant difference between a DSP-based transient signal detection device (TSDD), and the novel SDI is that in the SDI the analog-to-digital conversion was synchronized with the DSP data processing, i.e., all generated data could be immediately "consumed" by the DSP, without using intermediate memory buffers between the ADC and DSP. The DSP stores the results of the integration in a pre-defined number of channels, or memory registers, that are not shared with the ADC. The SDI allows low (10%, 1%, or even zero) overhead, continuous, digital integration in a lock-in approach. Thus the speed of the ADC was effectively limited by the DSP processing power. The prototype embodiment used a 33 MHz, 16-bit, fixed point DSP made by Analog Devices (ADSP2171) that can execute most instructions in a single 33 ns clock cycle. To maximize the number of samples collected by a prototype using one DSP and TTL logic only, a 24 MHz DSP clock was used with two 24 MHz ADCs 180° out of phase, and an intermediate adder. (The reference interface should then also output a second trigger signal 180° out of phase with the primary trigger signal.) See FIG. 5, depicting the ADC schematically. (The numbers "8, " "9, " and "16" adjacent to the arrows in FIG. 5 indicate the number of bits being transferred between the indicated elements in one clock cycle, as discussed further below.) The sequence of operations in the ADC block repeated every ~42 ns, and the outputs of the two converters were added in one clock cycle as follows: at a time 2Δt after the rising edge of the DSP clock, data from the intermediate buffer and data from the ADC2 were latched into adder input buffers; at a time 3Δt+20.84 ns after the rising edge, new data from ADC 1 were latched into the intermediate buffer (to be added during the next clock cycle); and on the next rising edge of the DSP clock, the sum was latched into the adder output buffer. "Δt" denotes the average delay per invertor gate, typically on the order of 1 to 2 ns.

Using this sequence, the prototype DSP could read one 9-bit number every 42 ns, representing the sum of two consecutive samples collected 2.5 and 2 DSP clock cycles earlier. Information on individual samples was therefore not measured directly, a matter of little consequence since the usual goal of these measurements is the summation of the input signal; in addition, this technique has the advantage of doubling the number of collected samples during a single DSP clock cycle. When time-resolved data are needed, the values read by the DSP may be divided by 2 to obtain the mean of two subsequent 48 MHz samples, which yields better information than a single 24 MHz sample. (The reason why the full speed of the DSP was not used was that the ADC's used were limited to 25 MHz.) The combination of two converters 180° out of phase with an intermediate adder allowed collection of more data points with the same DSP clock than with one ADC alone. Because each datum read by the DSP was the sum of two samples, one from each ADC, any problems arising from slightly mismatched ADC support circuitry were greatly reduced. In addition to its digital components, the ADC block also contained analog circuitry to provide reference voltages for the ADCs, and buffering for the incoming signal.

Note that the ADC block was designed so that data were "consumed" and processed by the DSP "on the fly."

The preamplifier described above, in combination with this ADC block, optionally allow the SDI to be used in regular photon-count experiments (in the prototype, at a rate up to $10^7$ photons/s with widening set at ~100 ns); or in time-resolved photon detection experiments (in the prototype, up to $2\times10^6$ photons/s); or for the measurement of pulse height distributions in pulsed signal applications (some silicon detectors use pulse heights to determine the energy of photons incident on the detector). In each application, there is low or zero overhead because of the immediate data processing. In a specialized application, there is zero overhead when the DSP is used to perform time-resolved detection of the height of peaks in the digitized signal.

Figure 6:
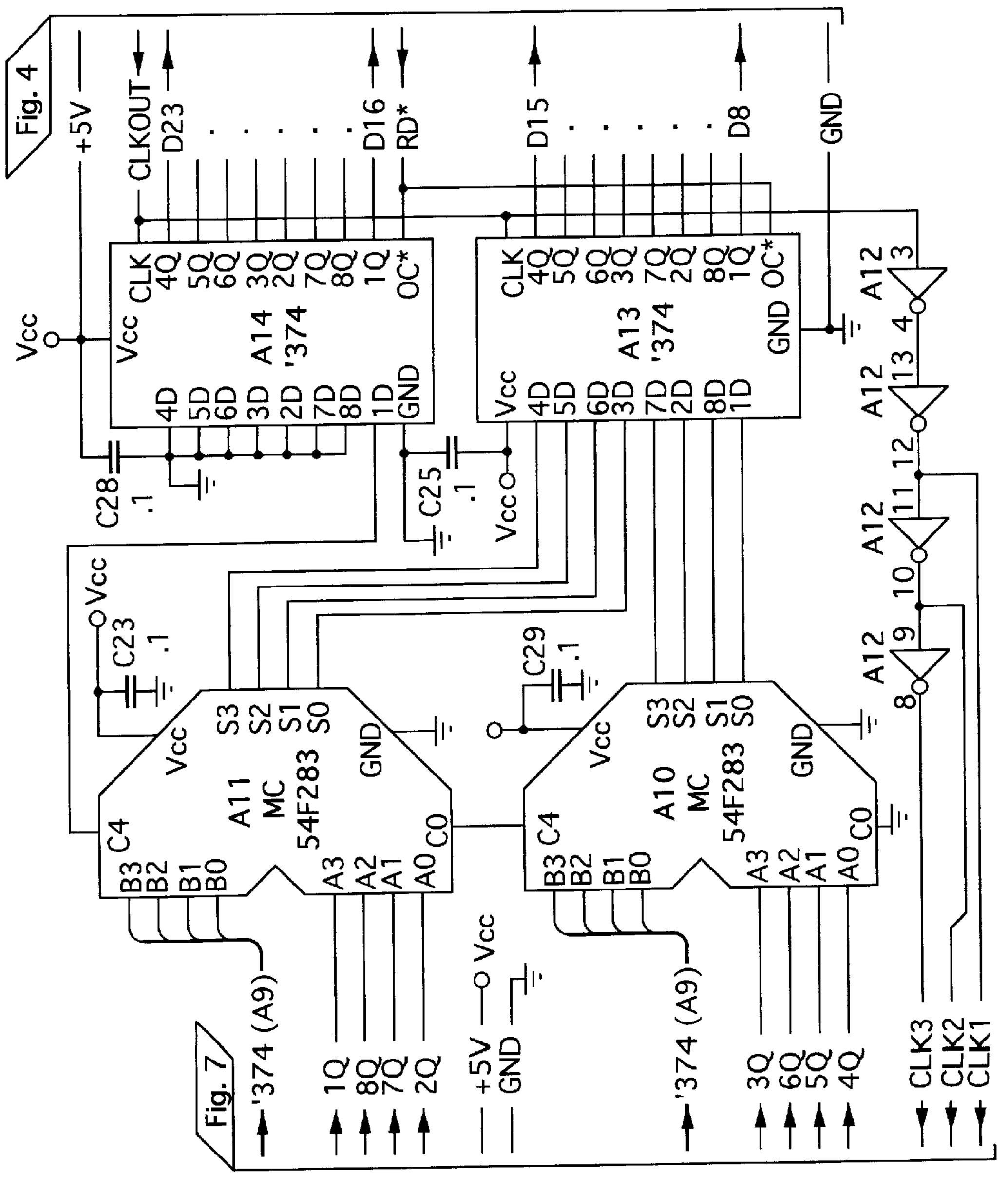
FIGS. 6 and 7 depict the circuitry of the ADC block used in one embodiment of the present invention.
Figure 7:
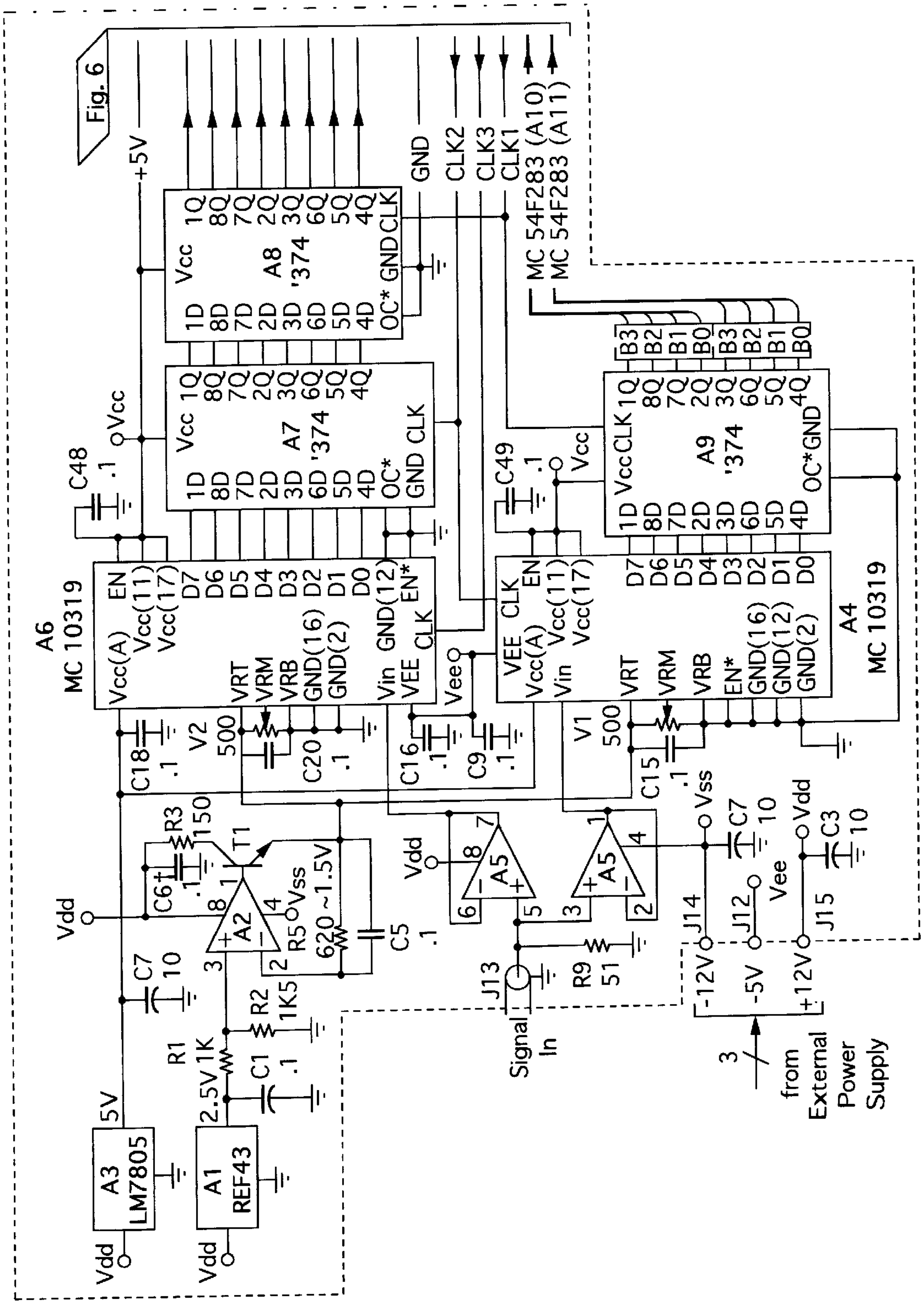

The circuitry of the prototype ADC block is illustrated in FIGS. 6 and 7. In FIG. 6, A12 is SN74AS04. In FIG. 7, there were bypass 0.1 μF capacitors (not shown) at the power supply pins of all IC's (except A23); as well as at $V_{cc}$A, VRT, VRM, and $V_{cc}$−11 of A4; and $V_{cc}$−11, VRT, and VRM of A6. A2 and A5 were both MC34002, and T1 was 2N2222A.

Figure 8:
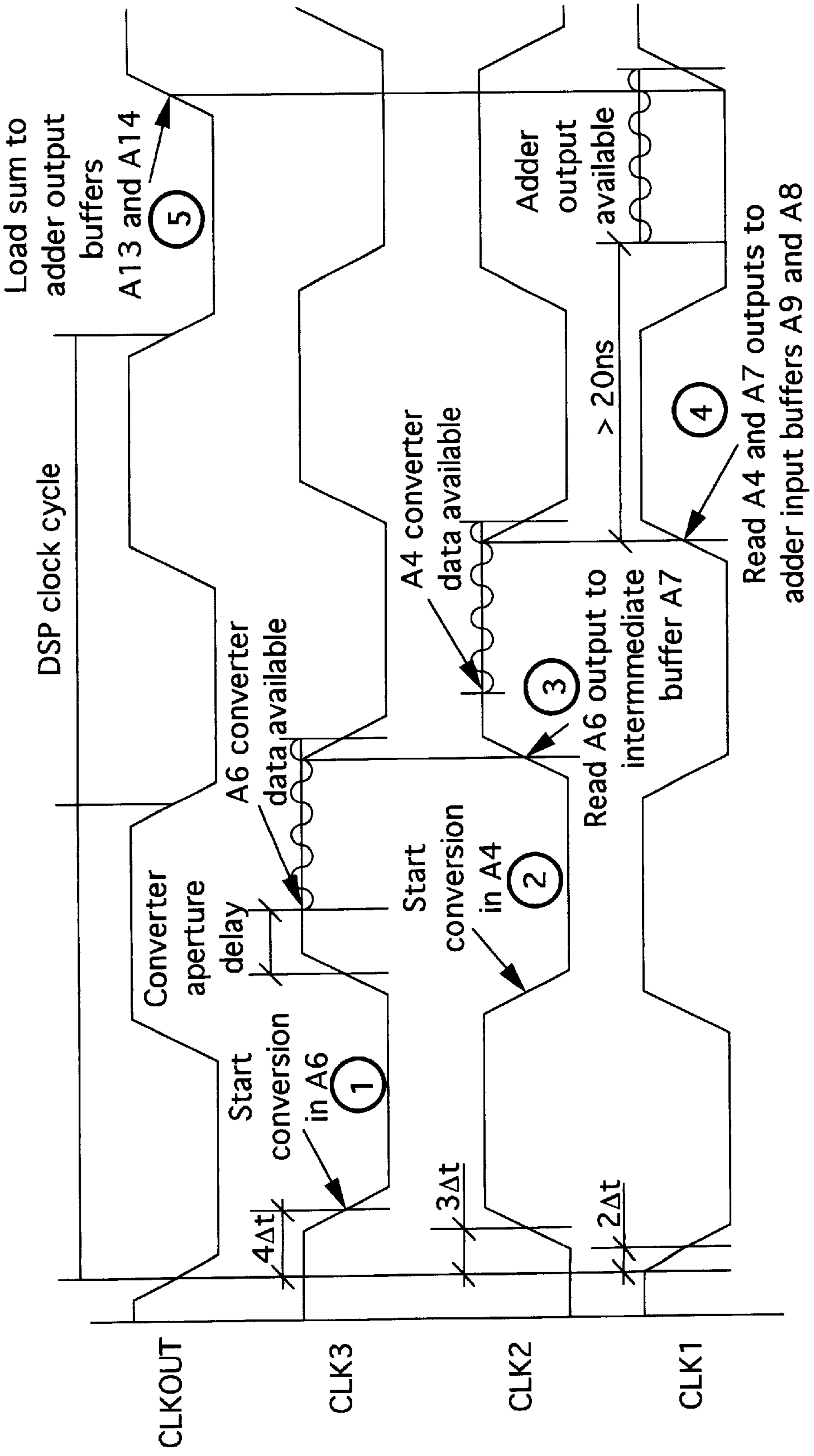
FIG. 8 depicts a time diagram for the ADC block of FIGS. 6 and 7.

FIG. 8 depicts a time diagram for the ADC block. The signal entered the DSP through BNC connector J13, which was grounded with 51 Ω resistor R9. The signal was then fed to the non-inverting inputs of two buffer amplifiers A5, each of which served one ADC. Both amplifiers were in the simple emitter follower setup, with output and inverting pins separated so that an RC component could be inserted in the feedback loop. In the prototype embodiment, the pins were simply connected by a jump wire. Output from the first amplifier A5 was connected to the input of converter A4. Output from the second amplifier A5 was connected to the input of converter A6. Both ADC's were MC10319 8-bit, 30 MHz converters. Their input range and linearity were determined by the voltage on the VRT, VRM and VRB pins. In the SDI, the VRB pin was connected directly to ground, while the voltage applied to the VRT was supplied by a 1.5 V reference circuit built around a precise 2.5 V reference IC (A1) and operational amplifier-transistor (A2-T1 ) combination. The +2.5 V output voltage on A1 and filtering capacitor C1 was lowered to 1.5 V through the R1 and R2 1:1.5 resistor divider. The A2-T1 combination with R5 and C5 in the emitter follower feedback loop provided temperature stabilization and noise filtering. To achieve better linearity, ten-turn precise trimmers V1 and V2 were used to set the VRM pins to a voltage exactly intermediate between the VRT and VRB.

This circuitry had the following power requirements: +12 V, −12 V, −5 V, and +5 V for the analog portion, and +5 V for the ADC digital component. The −12 V, −5 V, and +12 V were provided by an external power supply through the J14, J12, and J15 connectors, respectively. For filtering purposes, J14 and J15 were bypassed to ground by capacitors C7 and C3, respectively. To reduce noise, the +5 V required for the ADC analog component was provided by the voltage regulator A3 (LM7805) and the filtering capacitor C7, instead of the +5 V power lines common to the digital IC's on the DSP board. All power pins on the amplifiers, the ADC's, and the IC's (except A23) were bypassed to ground with 0.1 μF ceramic capacitors.

The 8-bit digital outputs from the two converters were added by the 8-bit adder, and the 9-bit output was read by the DSP. To buffer converted samples from two ADCs shifted 180° in phase (i.e., half the DSP cycle), and to make their sum available to the adder output buffer, three clocks were used: CLK1, CLK2, and CLK3. All three clock signals were generated from the DSP clock (CLKOUT) by A12: CLK1 was CLKOUT delayed by ~4 ns (using two NOT gates to create the delay), CLK2 was CLKOUT inverted and delayed by three NOT gates, and CLK3 was CLKOUT delayed by four NOT gates.

The conversion/addition operation, which required 2½ DSP clock cycles, can be described by the following five steps (see also the timing diagram shown in FIG. 8): (1) Converter A6 began conversion on the falling edge of CLK3. (2) Half a clock cycle later, the result from A6 became available (the rising edge of CLK3), and conversion in A4 was initiated (the falling edge of CLK2). (3) On the following rising edge of CLK2, the converter A6 output was loaded into intermediate buffer A7 (SN74AS374), and the data on A4 became available. (4) The outputs of A4 and A7 were loaded into input buffers A8 and A9 (both SN74AS374) half a clock cycle later; these two 8-bit numbers were added by two 4-bit full adders A11 and A10 (both MC54F283) during the next CLK1 cycle. (5) Finally, on the next rising edge of CLKOUT, the sum was transferred to the adder output buffer, comprising A13 and A14 (both SN74AS374), where the sum could be accessed by the DSP.

Because the DSP needed to access only one external memory location, namely the adder output buffer, no address decoding circuitry was required. Thus the RD* DSP pin could be connected directly to the high-impedance control pins on buffers A13 and A14. However, from an abundance of caution, all software used in the prototype embodiment was written as if the adder output buffer were located at address 0000H. The upper 7 bits of the adder output were padded with zeros (A14), because the DSP operated on 16-bit numbers.

Future improvements to the design of the prototype ADC block are planned. By lowering the preamplifier noise (as previously discussed), it becomes feasible to use ADCs with higher resolution (e.g., 12-bits). The step of adding samples together before they are read to the DSP can be modified in either of at least two directions. In the first modification, one fast converter (e.g., 100 MHz) and one ECL adder are used to add four subsequent samples, which are then read by the DSP. A drawback to this approach is that the resolution of a 100 MHz ADC is currently limited to 8–10 bits. However, that limitation should not present a major problem since our current prototype has used 8-bit ADCs successfully. Another approach is to use four 12-bit 25 MHz ADC's, shifted 90°, 180°, and 270° out of phase with respect to one another, combined with the three adder stages to provide the DSP with the sum of four ADC outputs once per DSP clock cycle. Another improvement planned for the ADC block is to add circuitry for fast photon-counting and time-resolved photon detection. The former can be implemented with DSP-accessible and controllable counters, while the latter can be achieved with a fast 1-bit converter (i.e., a discriminator or comparator), whose state could then be either added by the adder circuitry or directly read by the DSP. The original prototype already permits such experiments, but is restricted to low light intensities so that widened pulses do not overlap. The newer circuitry would push the limits toward higher photon counts.

Digital Signal Processor and Software

The power of the DSP lies in its ability to perform many tasks simultaneously. We have used this ability extensively, to attempt to optimize on-the-fly data processing. The prototype instrument and software can perform on-the-fly, point-by-point, time-resolved integration (averaging) for signals with periods as short as 200 ns, spending a maximum of 12% of total experimental time on the data processing, and the remaining 88% on data collection. The software used to operate the prototype had only 8% data processing "overhead" time, allowing 92% of the operational time to be devoted to data collection—a factor of great importance in experiments of long duration (hours or days).

The DSP software described here has been designed to handle both periodic and non-periodic signals. The first mode described below can be used for either type of signal, and does not discriminate between them. However, the other modes are designed specifically for periodic signals.

If one signal is denoted as i(t), and its averaged counterpart by $i_{avg}(t)$, then point-by-point averaging can be described mathematically as $$i_{avg}(t) = \frac{1}{N}\sum_{n=0}^{N-1} i(t+nT)$$

where n is an integer, N is the total time of summation, expressed in units of one period (T). The term $i_{avg}(t)$ may also be referred to as the average-within-the-period, time-resolved profile. For illustrative purposes a 20 μs periodic signal is used. For a 20 82 s signal, a 48 MHz ADC block digitizes about 956 samples per period. These samples are supplied to the DSP as 478 two-sample sums. These sums are then added by the DSP based on the selected mode (described further below). The reference signal indicates to the DSP when a new period starts.

The simplest manner of data acquisition is probably to have the DSP sum all data samples from the ADC block. For example, the total intensity of light hitting a PMT is directly proportional to the sum of samples collected by the computer. The "summation" mode can be used, for example, to generate absorption spectra. The usual integration time for an absorption spectrum is 0.5–5 s, depending on the absorptivity of the sample, scan speed, and desired spectrum quality.

A useful variation of the simple summation method is the "constant-signal-to-noise ratio" method. In this mode, the integration time is not determined in advance as a fixed number of cycles, but instead depends on the strength of the signal—the lower the signal level, the longer the summation time. Data are integrated until the sum exceeds a defined threshold. In measuring a spectrum, for example, an advantage of this mode is to keep the noise level constant for all points in the absorption spectra.

In another data acquisition mode, the DSP uses information from the reference interface to distinguish between different parts of a signal period, and then to integrate those parts separately by "windowing" a selected portion (or portions) of the signal. Data is collected only during the selected "windows." This acquisition mode allows collection only of data that is of interest. Other portions of the signal are ignored. In addition to being able to collect data on separate components of the signal, an advantage of this mode is the fact that signals for all windows go through the same electronic pathways, and therefore any biases that might be present in the system affect the different windows similarly. Therefore, all window sums have the same accuracy. This method can be used, for example, to separately integrate light of different polarizations. A similar mode can be used with a constant S/N ratio; the integration can be selected to stop when one of the window sums reaches a defined threshold, or when the total sum of window sums reaches a threshold.

The limiting case for the windowing mode is a time-resolved mode in which the number of windows equals the maximum number of samples that can collected in one period. To do so without having delay times between samples of subsequent windows, thereby increasing overhead, a buffer is used, the number of elements of which equalled the number of samples that can be collected in one period. Then, in a circular or cycling fashion (e.g., when the end of the buffer is reached, starting over from the beginning) simply take one sample from the ADC block and add it to the correct element. In the prototype, even though a new sample was available at the ADC block every 42 ns, only every other sample could actually be used, because the DSP required at least two cycles to fetch a sum from the buffer, add new data, and store the result back in the buffer. The number of buffer elements therefore corresponded to the number of 83 ns intervals that fit in one period. Since that number is not necessarily an integer, the DSP resynchronizes with the reference signal periodically (every four modulation periods in the case of the prototype).

The average time-resolved cycle profile was stored by the computer, and new measurements could then be taken. When spectra were measured, for example, once data for one wavelength had been fetched from the SDI, the incident light wavelength was changed and the process repeated.

A unique feature of this invention is the ability to measure point-by-point averages of selected portions of high frequency periodic signals with low "overhead" time, 8% in the prototype, figures expected to be even lower in future embodiments.

The DSP block of the prototype embodiment contained the clock and power interface circuitry shown in FIG. 4. Power required for the normal operation of the SDI was supplied from an external power supply through connectors J10 and J11. Each connector had a pair of 10 $\mu$F and 0.1 $\mu$F capacitors connected between +5 V and ground lines: C30 and C4 for J10, and C26 and C27 for J11. The DSP clock was generated by a 12.000 MHz processor grade crystal (A21), and corresponding capacitors C36 and C37 connected to XTAL and CLKIn pins. Other oscillator components were built into the processor.

Future embodiments will incorporate an external DSP memory to permit a higher number of pre-defined channels, and a correspondingly higher resolution.

Parallel Interface

In a preferred embodiment, the novel device operates in conjunction with a programmed computer. The computer's resources, such as the hard disk and graphics, can be used for functions such as data storage and display, thus reducing requirements on the instrument and lowering its price. The computer can also act as a boot host for the instrument, i.e., download operational software to the DSP upon a power-up or a reset. In general, the DSP could boot in at least two different ways: from the PROM attached to the processor, or from the host computer (processor) through the host interface port (HIP). To minimize hardware on the DSP board, in the prototype the HIP method has been used. The HIP is a set of registers that reside on the DSP, and that can be read and written either externally by a host computer, or internally by the DSP processing core. The property that distinguishes them from other DSP registers is their asynchronous mode of operation; i.e., they can be accessed regardless of what the rest of the DSP is doing. Control registers are used to prevent data from being overwritten if the DSP is ready to write new data before the old data have been read.

The SDI is a modular and transportable device that is compatible with most newer and older generation computers. Communication with the computer should take place through a standard interface, such as the serial RS232 port or parallel (printer) port available on most personal computers, preferably the parallel port. Another possibility is an expansion card with a digital parallel output port, but relatively few computers have such a card.

Figure 9:
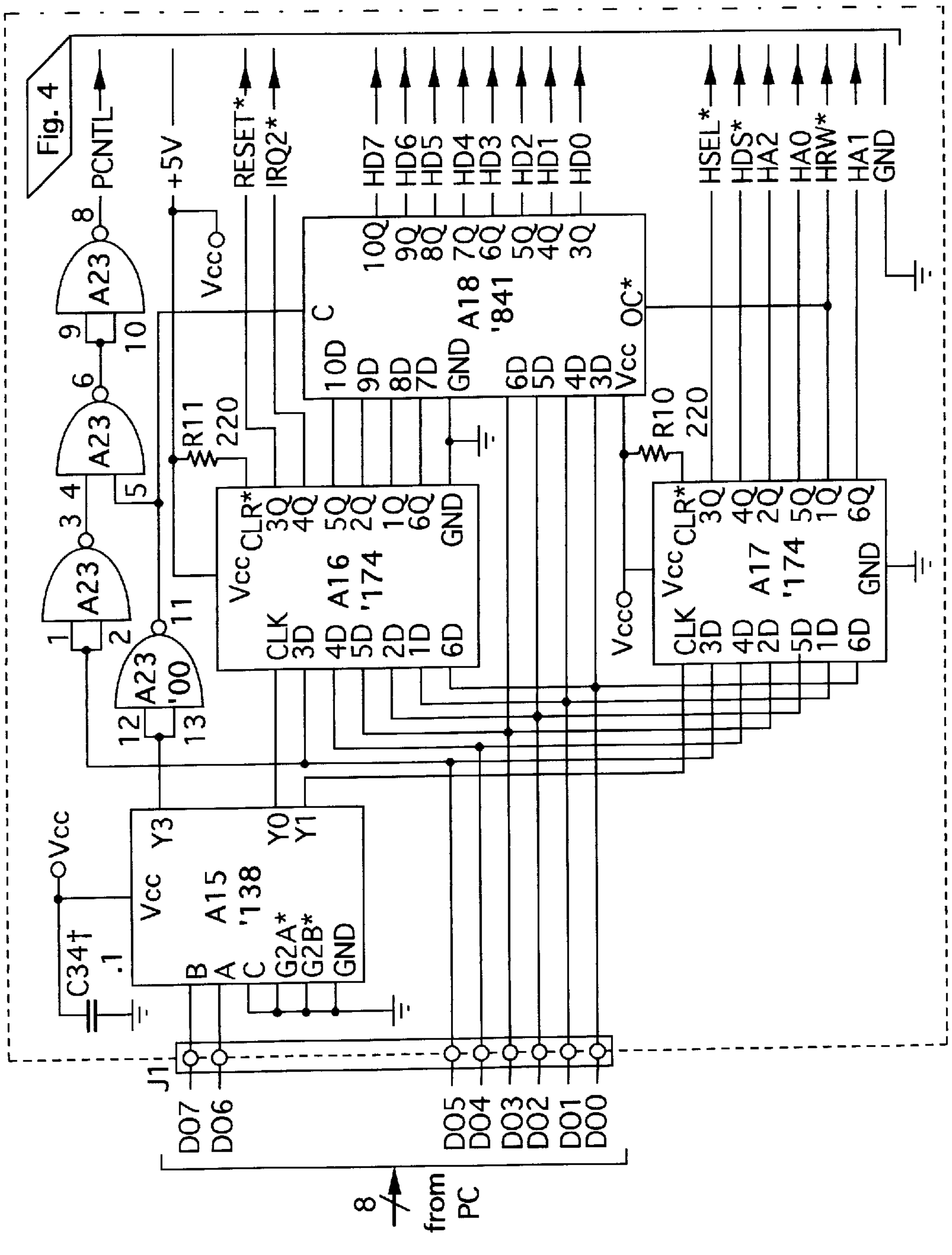
FIG. 9 depicts a circuit diagram of the parallel interface used in one embodiment of the present invention.

A circuit diagram of the parallel interface used in the prototype embodiment is depicted in FIG. 9. Again, there were bypass 0.1 $\mu$F capacitors (not shown) at the power supply pins of all IC's.

EXAMPLE

The MPS of the First Rydberg Electronic Transitions of (+)-3-methylcyclopentanone Several spectra have been measured with the assistance of the prototype SDI, revealing spectral structure and resolutions not previously achieved.

Light polarization was altered with fast modulators (modulation frequency ~50 KHz). The prototype SDI connected to a single detector was used to separately and selectively measure the polarization-dependent intensities of electronic transitions. The selectively measured, modulated polarization spectral intensities were plotted in three-dimensional form (as a function of both wavelength and light polarization).

Polarization spectroscopy (PS) provides information not otherwise available, because the polarized light can be used to emphasize interactions that are influenced by molecular structures. Consequently, PS is becoming a method of choice in areas such as structural molecular biology, biochemistry (protein structures and folding dynamics), molecular electronic structure (natural and field-induced chirality), and materials science (surfaces, molecular layers, magnetic and optical processing).

The main element of a modulated-polarization spectroscopy (MPS) experimental setup is a photoelastic modulator (PEM), or other phase shifter for light-polarization modulation. The experimental configuration can be expanded by imposing static or alternating, magnetic or electric fields on the sample. Recent attempts to interpret the MPS measurements of some Rydberg molecular electronic (rovibronic) transitions in magnetic fields have indicated an unfilled need for a new polarization-selective MPS method; an unfilled need for an MPS device which simultaneously and selectively measures intensities associated with differently polarized light (such as linearly polarized (LP), left circularly polarized (LCP), right circularly polarized (RCP), etc.) in a single run during which experimental conditions do not change; and an unfilled need for a device that can take such measurements with a single detector to minimize noise. Such a device could efficiently and simultaneously measure electronic transition intensities as a function of both wavelength ($\lambda$) and polarization (II). Prior instrument designs cannot make such simultaneous measurements, although the novel SDI can.

The first Rydberg electronic transitions of the (+)-3 methylcyclopentanone molecule were chosen for an initial evaluation of the prototype SDI because of the molecule's well-known optical activity and optical strength.

In addition to the SDI, the experimental apparatus to generate linearly polarized light included a Hinteregger hydrogen lamp, a 1 m McPherson Model 225 normal incidence monochromator equipped with a 1200 line/mm grating, a spherical Al mirror, and a Wollaston $MgF_2$ prism as a linear polarizer. The PEM was a standard product of Hinds Instruments (Hillsboro, Oreg.), using a $CaF_2$ crystal for polarization modulation of incoming LP light. Low pressure gaseous (+)-3-methylcyclopentanone (99%, Aldrich) was contained in a sample cell. The detector was an EMI-9635-QB photomultiplier tube (PMT) with a fused silica window. Similar MPS-SDI configurations were used when the Hinteregger lamp was replaced by a synchrotron or other light source. The PMT was connected to a current-to-voltage (I/V) converter/preamplifier, whose output was fed to the SDI, which was also connected to the computer. The overall data acquisition process was controlled by computer programs, while specific data acquisition modes were controlled by programs downloaded to the SDI.

Experimental parameters were as follows: step size, 0.0015 nm; slit width, 130 $\mu$m; pressure, 0.6 Torr; integration interval, 5 s; time-resolved, constant signal-to-noise mode (due to high sample absorbance, the constant S/N mode was disabled between 198.7 and 198.8 nm); total measurement time, 18 hours.

It was found by SDI that the signals were neither sinusoidal nor symmetric. Consequently, conventional lock-in amplifiers could not measure these signals as precisely as the novel SDI.

Figure 10:
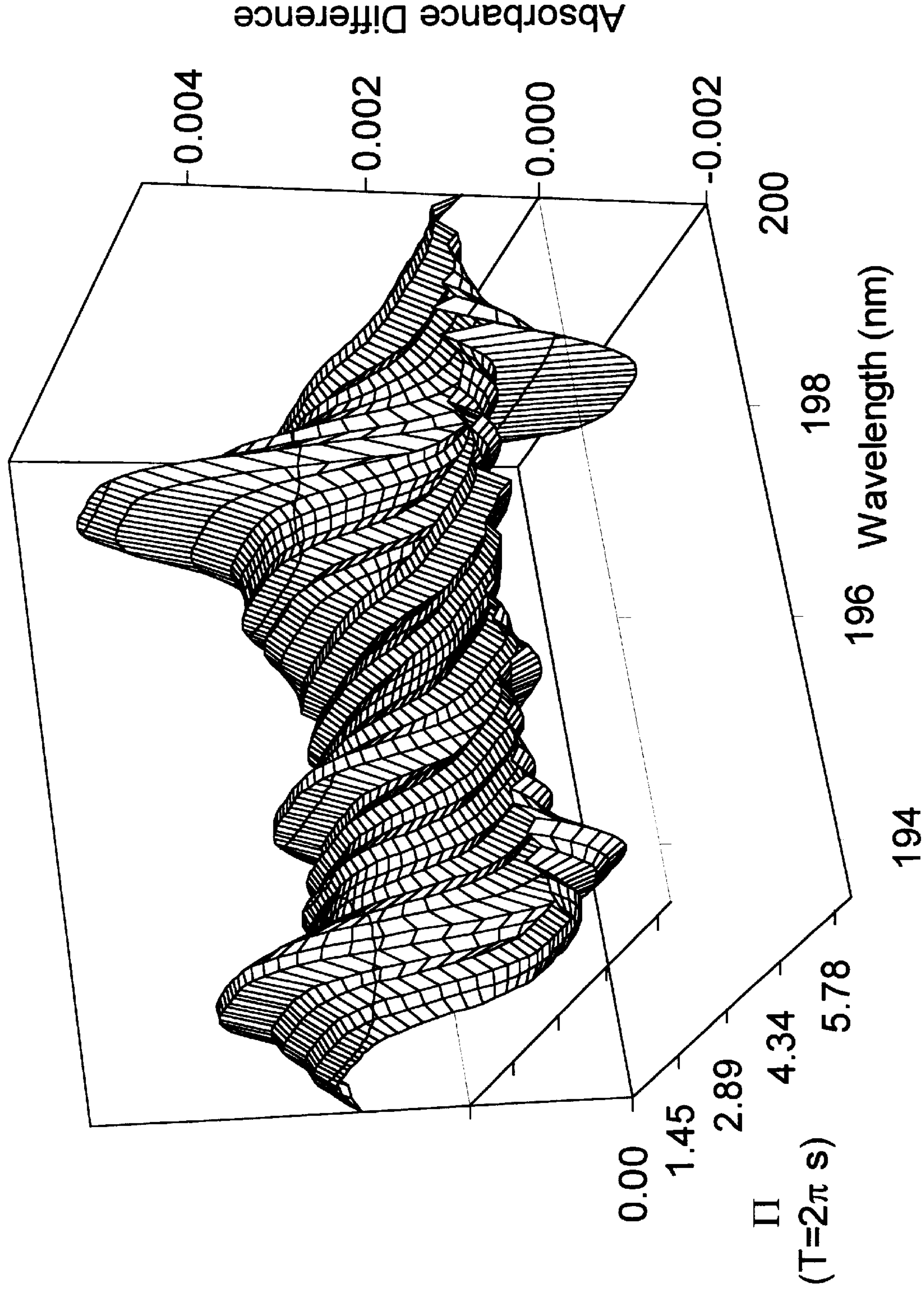
FIG. 10 depicts a three-dimensional plot of the wavelength-dependent difference between the absorbances of light with general and linear polarizations in the range 193 to 200 nm for the first Rydberg electronic transitions of (+)-3-methylcyclopentanone.
Figure 11:
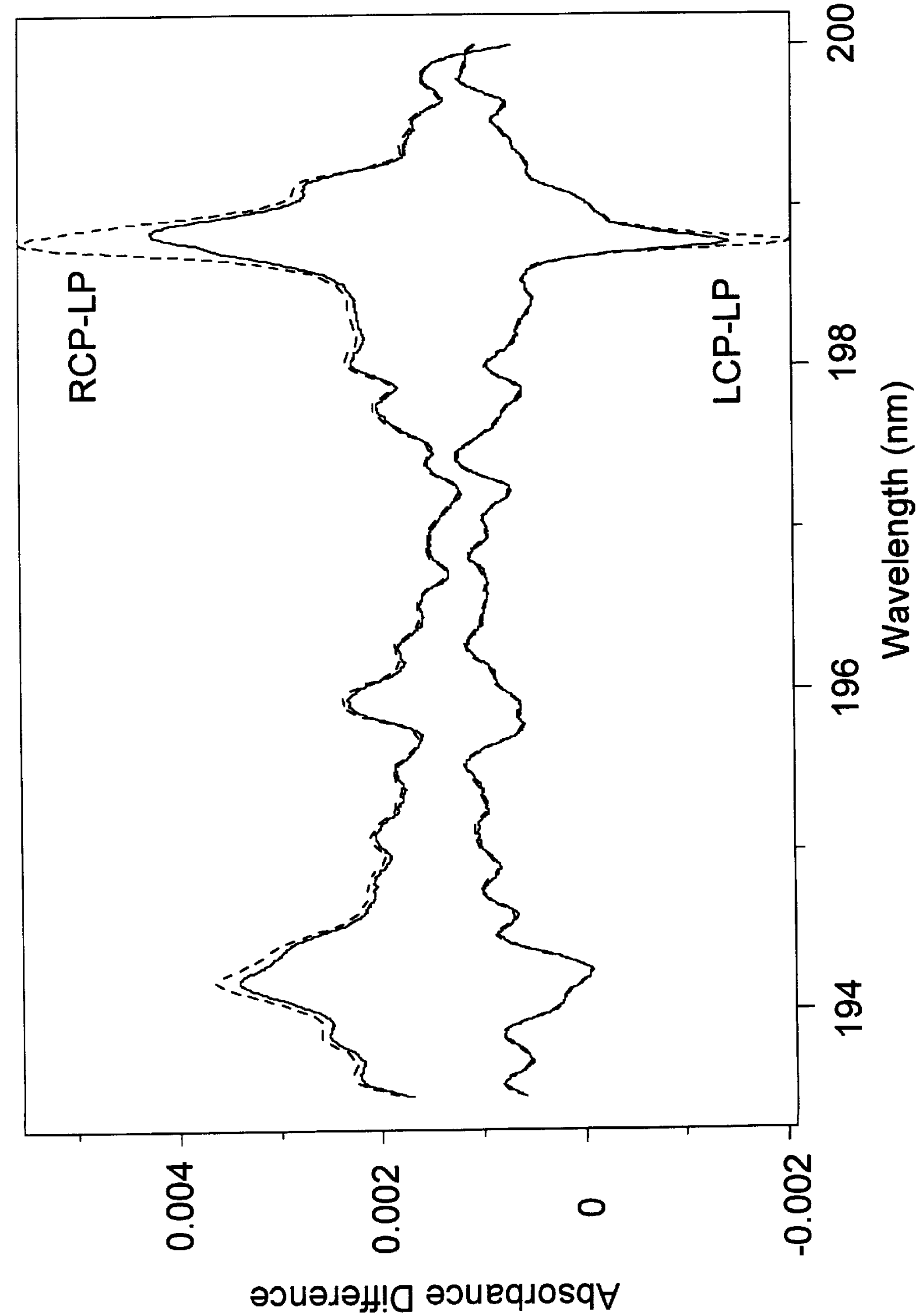
FIG. 11 depicts two-dimensional cross sections of the three-dimensional curves for left circular polarized light and right circular polarized light for the first Rydberg electronic transitions of (+)-3-methylcyclopentanone.
Figure 12:
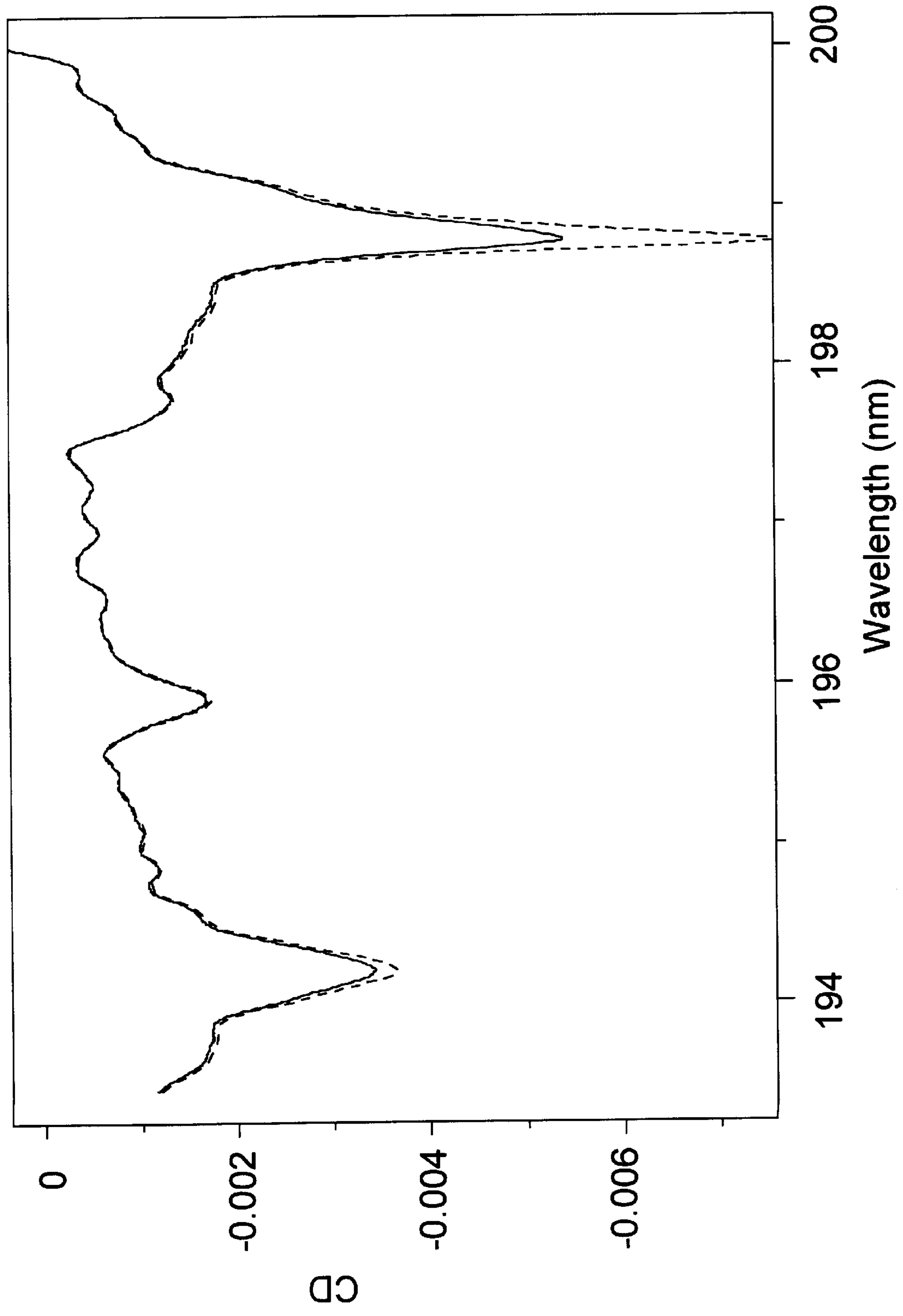
FIG. 12 depicts the circular dichroism spectrum for the first Rydberg electronic transitions of (+)-3-methylcyclopentanone.

A three-dimensional plot of the wavelength-dependent difference between the absorbances of light with general and linear polarizations in the range 193 to 200 nm is shown in FIG. 10. Two-dimensional cross sections of the three-dimensional curves for left circular polarized light and right circular polarized light are illustrated in FIG. 11. The corresponding circular dichroism spectrum is illustrated in FIG. 12. The circular dichroism spectrum is equal to the difference between the left circular polarized light spectrum and the right circular polarized light spectrum. Although prior techniques exist for measuring circular dichroism, this is the first technique known for separating out the left circular and right circular components of that spectrum. These selective polarization spectra are believed to be the first of their kind. The availability of these separate components of the spectrum will allow additional molecular information to be deduced. Both of these figures illustrate raw results (solid lines) and corrected spectra (dashed lines). Polarization-selective measurements also permit the simultaneous measurement of linear dichroism, circular dichroism, and high-quality absorption spectra, which had not previously been possible.

The complete disclosures of all references cited in this specification are hereby incorporated by reference. In the event of an otherwise irreconcilable conflict, however, the present specification shall control.

We claim:

1. A selective digital integrator for receiving an analog signal, and selectively and digitally integrating components of the analog signal into a pre-defined number of channels in synchrony with a reference signal; said integrator comprising a reference interface, an analog-to-digital converter, and a processor; wherein:

(a) said reference interface is adapted to receive the reference signal, to recognize a pre-defined portion of the reference signal, and to output a trigger signal to said processor each time the pre-defined portion of the reference signal occurs;

(b) said analog-to-digital converter is adapted to convert the analog signal to a digital signal, and to output the digital signal directly to said processor; wherein the digital signal is not stored in memory before being output to said processor; and (c) said processor is adapted to integrate the digital signal from said analog-to-digital converter, as the digital signal is received by said processor, in synchrony with the trigger signals from said reference interface, into a pre-defined number of channels that is at least five.

2. A selective digital integrator as recited in claim 1, additionally comprising a pre-amplifier adapted to widen and amplify a peak in the analog signal before the analog signal is input to the analog-to-digital converter; such that the temporal width of the amplified peak is at least five times the interval between consecutive digital signals processed by said processor; and such that the height of the amplified peak is such that at least one point within the amplified peak is above the threshold for detection by the analog-to-digital converter.

3. A selective digital integrator as recited in claim 2, wherein said pre-amplifier is adapted to amplify a peak in the analog signal such that the height of the amplified peak is such that at least five points within the amplified peak are above the threshold for detection by the analog-to-digital converter.

4. A selective digital integrator as recited in claim 2, wherein said pre-amplifier is adapted to convert an analog current signal to an analog voltage signal, wherein the voltage of the analog voltage signal is within the range that can be measured by the analog-to-digital converter.

5. A selective digital integrator as recited in claim 2, wherein the bandwidth of said pre-amplifier is at least about 25 MHz.

6. A selective digital integrator as recited in claim 2, wherein the bandwidth of said pre-amplifier is at least about 100 MHz.

7. A selective digital integrator as recited in claim 2, wherein the bandwidth of said pre-amplifier is at least about 500 MHz.

8. A selective digital integrator as recited in claim 2, wherein the bandwidth of said pre-amplifier is at least about 1 GHz.

9. A selective digital integrator as recited in claim 1, wherein said reference interface is also adapted to output a trigger signal to said processor 180° out-of-phase from each occurrence of the pre-defined portion of the reference signal.

10. A selective digital integrator as recited in claim 9, additionally comprising a second analog-to-digital converter as recited, wherein the second analog-to-digital converter is adapted to operate 180° out-of-phase with the first analog-to-digital converter.

11. A selective digital integrator as recited in claim 1, wherein said analog-to-digital converter is adapted to output 8-bit digital signals.

12. A selective digital integrator as recited in claim 1, wherein said analog-to-digital converter is adapted to output 12-bit digital signals.

13. A selective digital integrator as recited in claim 1, wherein said analog-to-digital converter is adapted to output 16-bit digital signals.

14. A selective digital integrator as recited in claim 1, wherein said analog-to-digital converter is adapted to operate continuously, with no dead time in operation.

15. A selective digital integrator as recited in claim 1, wherein said selective digital integrator is adapted to integrate components of the analog signal in lock-in mode.

16. A selective digital integrator as recited in claim 1, wherein said processor is adapted to store the results of the integration in memory that is not shared with the analog-to-digital converter.

17. A selective digital integrator as recited in claim 1, wherein the potentially available data from the analog-to-digital converter lost due to data processing time is less than about 10%.

18. A selective digital integrator as recited in claim 1, wherein the potentially available data from the analog-to-digital converter lost due to data processing time is less than about 1%.

19. A selective digital integrator as recited in claim 1, wherein essentially no available data from the analog-to-digital converter is lost due to data processing time.

20. A selective digital integrator as recited in claim 19, wherein said processor is adapted to perform time-resolved detection of the height of peaks in the digitized signal.

21. A selective digital integrator as recited in claim 1, wherein the bandwidth of said processor is at least about 25 MSPS.

22. A selective digital integrator as recited in claim 1, wherein the bandwidth of said processor is at least about 100 MSPS.

23. A selective digital integrator as recited in claim 1, wherein the bandwidth of said processor is at least about 500 MSPS.

24. A selective digital integrator as recited in claim 1, wherein the bandwidth of said processor is at least about 1 GSPS.

25. A selective digital integrator as recited in claim 1, additionally comprising a serial interface or a parallel interface to output data from the channels of the processor to a digital computer.

26. A method for receiving an analog signal, and selectively and digitally integrating components of the analog signal into a pre-defined number of channels in synchrony with a reference signal, said method comprising the steps of:

(a) receiving a reference signal, recognizing a pre-defined portion of the reference signal, and outputting a trigger signal each time the pre-defined portion of the reference signal occurs;

(b) converting the analog signal to a digital signal, and outputting the digital signal directly, wherein the digital signal is not stored in memory before being output; and (c) integrating the output digital signal, in synchrony with the trigger signals, into a pre-defined number of channels that is at least five.

27. A method as recited in claim 26, additionally comprising the step of widening and amplifying a peak in the analog signal before the analog signal is converted to a digital signal; such that the temporal width of the amplified peak is at least five times the interval between consecutive digital signals processed by said processor; and such that the height of the amplified peak is such that at least one point within the amplified peak is above the threshold for detection in said analog-to-digital converting step.

28. A method as recited in claim 27, wherein said widening and amplifying step amplifies a peak in the analog signal such that the height of the amplified peak is such that at least five points within the amplified peak are above the threshold for detection in said analog-to-digital converting step.

29. A method as recited in claim 27, wherein said widening and amplifying step converts an analog current signal to an analog voltage signal, wherein the voltage of the analog voltage signal is within the range of said analog-to-digital converting step.

30. A method as recited in claim 27, wherein the bandwidth of said widening and amplifying step is at least about 25 MHz.

31. A method as recited in claim 27, wherein the bandwidth of said widening and amplifying step is at least about 100 MHz.

32. A method as recited in claim 27, wherein the bandwidth of said widening and amplifying step is at least about 500 MHz.

33. A method as recited in claim 27, wherein the bandwidth of said widening and amplifying step is at least about 1 GHz.

34. A method as recited in claim 26, wherein said receiving, recognizing, and outputting step also outputs a trigger signal 180° out-of-phase from each occurrence of the pre-defined portion of the reference signal.

35. A method as recited in claim 34, additionally comprising a second analog-to-digital converting step as recited, wherein said second analog-to-digital converting step operates 180° out-of-phase with said first analog-to-digital converting step.

36. A method as recited in claim 26, wherein said analog-to-digital converting step outputs 8-bit digital signals.

37. A method as recited in claim 26, wherein said analog-to-digital converting step outputs 12-bit digital signals.

38. A method as recited in claim 26, wherein said analog-to-digital converting step outputs 16-bit digital signals.

39. A method as recited in claim 26, wherein said analog-to-digital converting step operates continuously, with no dead time in operation.

40. A method as recited in claim 26, wherein said method integrates components of the analog signal in lock-in mode.

41. A method as recited in claim 26, additionally comprising the step of storing the results of the integrating step in memory that is not used in the analog-to-digital converting step.

42. A method as recited in claim 26, wherein the potentially available data from the analog-to-digital converting step lost due to data processing time is less than about 10%.

43. A method as recited in claim 26, wherein the potentially available data from the analog-to-digital converting step lost due to data processing time is less than about 1%.

44. A method as recited in claim 26, wherein essentially no available data from the analog-to-digital converting step is lost due to data processing time.

45. A method as recited in claim 44, wherein said integrating step performs time-resolved detection of the height of peaks in the digitized signal.

46. A method as recited in claim 26, wherein the bandwidth of said integrating step is at least about 25 MSPS.

47. A method as recited in claim 26, wherein the bandwidth of said integrating step is at least about 100 MSPS.

48. A method as recited in claim 26, wherein the bandwidth of said integrating step is at least about 500 MSPS.

49. A method as recited in claim 26, wherein the bandwidth of said integrating step is at least about 1 GSPS.

50. A method as recited in claim 26, additionally comprising the step of outputting the results of said integrating step to a digital computer.

* * * * *